(12) United States Patent
Campbell et al.

(10) Patent No.: US 7,348,205 B2
(45) Date of Patent: Mar. 25, 2008

(54) METHOD OF FORMING RESISTANCE VARIABLE DEVICES

(75) Inventors: Kristy A. Campbell, Boise, ID (US); Terry L. Gilton, Boise, ID (US); John T. Moore, Boise, ID (US); Jiutao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 143 days.

(21) Appl. No.: 11/085,009

(22) Filed: Mar. 21, 2005

(65) Prior Publication Data

US 2005/0157573 A1 Jul. 21, 2005

Related U.S. Application Data

(62) Division of application No. 09/943,199, filed on Aug. 29, 2001, now Pat. No. 6,955,940.

(51) Int. Cl.
*H01L 21/00* (2006.01)
(52) U.S. Cl. .................. 438/95; 257/E45.002
(58) Field of Classification Search .................. 438/95, 438/102, 103, 510, 535, 542, 550, 567, 795–799; 257/E45.002, E31.029
See application file for complete search history.

(56) References Cited

U.S. PATENT DOCUMENTS

| | | | |
|---|---|---|---|
| 3,271,591 | A | 9/1966 | Ovshinsky |
| 3,961,314 | A | 6/1976 | Klose et al. |
| 3,966,317 | A | 6/1976 | Wacks et al. |
| 3,983,542 | A | 9/1976 | Ovshinsky |
| 3,988,720 | A | 10/1976 | Ovshinsky |
| 4,177,474 | A | 12/1979 | Ovshinsky |

(Continued)

FOREIGN PATENT DOCUMENTS

JP 56126916 10/1981

(Continued)

OTHER PUBLICATIONS

Abdel-All, A.; Elshafie, A.; Elhawary, M.M., DC electric-field effect in bulk and thin-film Ge5As38Te57 chalcogenide glass, Vacuum 59 (2000) 845-853.

(Continued)

*Primary Examiner*—David Vu
(74) *Attorney, Agent, or Firm*—Dickstein Shapiro LLP

(57) ABSTRACT

A method of forming a resistance variable device includes forming a first conductive electrode material on a substrate. A metal doped chalcogenide comprising material is formed over the first conductive electrode material. Such comprises the metal and $A_xB_y$, where "B" is selected from S, Se and Te and mixtures thereof, and where "A" comprises at least one element which is selected from Group 13, Group 14, Group 15, or Group 17 of the periodic table. In one aspect, the chalcogenide comprising material is exposed to an $HNO_3$ solution. In one aspect the outer surface is oxidized effective to form a layer comprising at least one of an oxide of "A" or an oxide of "B". In one aspect, a passivating material is formed over the metal doped chalcogenide comprising material. A second conductive electrode material is deposited, and a second conductive electrode material of the device is ultimately formed therefrom.

52 Claims, 4 Drawing Sheets

U.S. PATENT DOCUMENTS

| | | | |
|---|---|---|---|
| 4,267,261 A | 5/1981 | Hallman et al. | |
| 4,316,946 A | 2/1982 | Masters et al. | |
| 4,375,125 A * | 3/1983 | Byatt | 438/762 |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,800,526 A | 1/1989 | Lewis | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,272,359 A | 12/1993 | Nagasubramanian et al. | |
| 5,296,716 A | 3/1994 | Ovshinsky et al. | |
| 5,314,772 A | 5/1994 | Kozicki et al. | |
| 5,335,219 A | 8/1994 | Ovshinsky et al. | |
| 5,341,328 A | 8/1994 | Ovshinsky et al. | |
| 5,359,205 A | 10/1994 | Ovshinsky | |
| 5,406,509 A | 4/1995 | Ovshinsky et al. | |
| 5,414,271 A | 5/1995 | Ovshinsky et al. | |
| 5,500,532 A | 3/1996 | Kozicki | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,751,012 A | 5/1998 | Wolstenholme et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,851,882 A | 12/1998 | Harshfield | |
| 5,869,843 A | 2/1999 | Harshfield | |
| 5,912,839 A | 6/1999 | Ovshinsky et al. | |
| 5,933,365 A | 8/1999 | Klersy et al. | |
| 6,011,757 A | 1/2000 | Ovshinsky | |
| 6,031,287 A | 2/2000 | Harshfield | |
| 6,072,716 A | 6/2000 | Jacobson et al. | |
| 6,087,674 A | 7/2000 | Ovshinsky et al. | |
| 6,141,241 A | 10/2000 | Ovshinsky et al. | |
| RE37,259 E | 7/2001 | Ovshinsky | |
| 6,339,544 B1 | 1/2002 | Chiang et al. | |
| 6,388,324 B2 | 5/2002 | Kozicki | |
| 6,404,665 B1 | 6/2002 | Lowrey et al. | |
| 6,429,064 B1 | 8/2002 | Wicker | |
| 6,437,383 B1 | 8/2002 | Xu | |
| 6,440,837 B1 | 8/2002 | Harshfield | |
| 6,462,984 B1 | 10/2002 | Xu et al. | |
| 6,469,364 B1 | 10/2002 | Kozicki | |
| 6,473,332 B1 | 10/2002 | Ignatiev et al. | |
| 6,480,438 B1 | 11/2002 | Park | |
| 6,487,106 B1 | 11/2002 | Kozicki | |
| 6,487,113 B1 | 11/2002 | Park et al. | |
| 6,501,111 B1 | 12/2002 | Lowrey | |
| 6,507,061 B1 | 1/2003 | Klersy et al. | |
| 6,511,862 B2 | 1/2003 | Hudgens et al. | |
| 6,511,867 B2 | 1/2003 | Lowrey et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowrey et al. | |
| 6,555,860 B2 | 4/2003 | Lowrey et al. | |
| 6,563,164 B2 | 5/2003 | Lowrey et al. | |
| 6,566,700 B2 | 5/2003 | Xu | |
| 6,567,293 B1 | 5/2003 | Lowrey et al. | |
| 6,569,705 B2 | 5/2003 | Chiang et al. | |
| 6,570,784 B2 | 5/2003 | Lowrey | |
| 6,576,921 B2 | 6/2003 | Lowrey | |
| 6,586,761 B2 | 7/2003 | Lowrey | |
| 6,589,714 B2 | 7/2003 | Maimon et al. | |
| 6,590,807 B2 | 7/2003 | Lowrey | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,614,049 B1 | 9/2003 | Koyama | |
| 6,621,095 B2 | 9/2003 | Chiang et al. | |
| 6,625,054 B2 | 9/2003 | Lowrey et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowrey et al. | |
| 6,671,710 B2 | 12/2003 | Ovshinsky et al. | |
| 6,673,648 B2 | 1/2004 | Lowrey | |
| 6,673,700 B2 | 1/2004 | Dennison et al. | |
| 6,674,115 B2 | 1/2004 | Hudgens et al. | |
| 6,687,153 B2 | 2/2004 | Lowrey | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,707,712 B2 | 3/2004 | Lowery | |
| 6,714,954 B2 | 3/2004 | Ovshinsky et al. | |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 * | 11/2002 | Kozicki et al. | 438/259 |
| 2002/0168852 A1 | 11/2002 | Kozicki | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |

| | | | |
|---|---|---|---|
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25—xSbx, Appl. Phys. A 55 (1992) 167-169.

Afifi, M.A.; Labib, H.H.; Fouad, S.S.; El-Shazly, A.A., Electrical & thermal conductivity of the amorphous semiconductor GexSe1—x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu—As—Se copositions, J. Non-Cryst. Solids 11 (1972) 97-104.

Asokan, S.; Prasad, M.V.N.; Parthasarathy, G.; Gopal, E.S.R., Mechanical and chemical thersholds in IV-VI chalcogenide glasses, Phys. Rev. Lett. 62 (1989) 808-810.

Baranovskii, S.D.; Cordes, H., On the conduction mechanism in ionic glasses, J. Chem. Phys. 111 (1999) 7546-7557, Belin, R.; Taillades, G.; Pradel, A.; Ribes, M., Ion dynamics in superionic chalcogenide glasses: complete conductivity spectra, Solid State Ionics 136-137 (2000) 1025-1029.

Belin, R.; Zerouale, A.; Pradel, A.; Ribes, M., Ion dynamics in the argyrdite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des metal das electrodes sur las caracteristiques courant-tension des structures M—Ag2Se—M, Thin Solid Films 70 (1980) L1-L4.

Bernede, J.C., Polarized memory switching in MIS thin films, Thin Solid Films 81 (1981) 155-160.

Bernede, J.C., Switching and silver movemnets in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin Solid Films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin Solid Films 97 (1982) 165-171.

Bernede, J.C.; Khelil, A.; Kettaf, M.; Conan, A., Transition from S- toN-type differential negative resistance in Al—Al203—Ag2—xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=1/3 in GexSe1—x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the intermediate phase in chalcogenide glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase seperation in GexSe1—x glasses, Solid State Comm. 45 (1983) 183-185.

Boolchand, P., Bresser, W.J., Compositional trends in glass transition temperature (Tg), network connectivity and nanoscale chemical phase seperation in chalcogenides, Dept. of ECECS, Univ. Cincinnati (Oct. 28, 1999) 45221-0030.

Boolchand, P.; Grothaus, J., Molecular Structure of Melt-Quenched GeSe2 and GeS2 glasses compared, Proc. Int. Conf. Phys. Semicond. (Eds. Chandi and Harrison) 17th (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyim P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; jakubowicz, A., Room-temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As—Te—Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag—Ge—Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2—xSe1+x/n—Si diodes, Thin Solid Films 110 (1983) 107-113.

El Gharras, Z.; Bourahla, A.; Vautier, C., Role of photoinduced defects in amorphous GexSe1—x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80—x films, Thin Solid Films 376 (2000) 236-240.

Fadel, M., Switching phenomenon in evaporated Se—Ge—As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X.; Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag—GeSe2 thin films, Phys. Rev. B 38 (1988) 12388-12403.

Fleury, G.; Hamou, A.; Viger, C.l Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge—Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium—selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahirn, M.M.; Dongol, M.; Hammad, F.H., Effect of composition on the structure and electrical properties of As—Se—Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballsitic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1—x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal trasition in Cr-hydrogenated amorphous Si—V thin-film devices, Phil. Mag. B. 74 (1996) 37-50.

Hu, J.; Snell, A.J.; Hajto, J.; Owen, A.E., Current-induced instability in Cr-p+a-Si:H—V thin film devices, Phil. Mag. B 80 (2000) 29-43.

Lizima, S.; Sugi, M.; Kikuchi, M.; Tanaka, K., Electrical and thermal properties of semiconducting glasses As—Te—Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase seperation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi, T.; Maruno, S.; Elliott, S.R., Optical, electrical, and structural properties of amorphous Ag—Ge—S and Ag—Ge—Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J. Nakamura, Y.; Aniya, M., Ionic conductivity of Agx(GeSe3)1—x (0<=x<=0.571) glasses, Solid State Ionics 123 (1999) 259-269.

Kluge, G.; Thomas, A.; Klabes, R.; Grotzschel, R., Silver photodiffusion in amorphous GexSe100—x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Korkinova, Ts.N.; Andreichin, R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of Pure & Appl. Phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1—x glass, Appl. Phys. Lett. 46 (1985) 543-545.

Matsushita, T.; Yamagami, T.; Okuda, M., Polarized memory effect observed on Se—SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2—V2O5 based glasses, Journal de Physique IV 2 (1992) C2-185-C2-188.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Miyatani, S.-y., Electronic and ionic conduction in (AgxCu1—x)2Se, J. Phys. Soc. Japan 34 (1973) 423-432.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161 parameters of GexSe1-x amorphous thin films, Jpn. J. App. Phys. 15 (1976) 849-853.

Nang, T.T.; Okuda, M.; Matsushita, T.; Yokota, S.; Suzuki, A., Electrical and optical parameters of GexSe1—x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile device, IEEE Proc. 129. (1982) 51-54.

Owen, A.E.; Firth, A.P.; Ewen, P.J.S., Photo-induced structural and physico-chemical change in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge—As—Se, Appl. Phys. Lett. 19 (1971) 221-223.

Popescu, C., The effect of local non-uniformities on thermal switching and high field behavior of structures with chalcogenide glasses, Solid-State Electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge—As—Te glasses, J. Phys. D: Appl. Phys. 29 (1996) 2004-2008.

Rahman, S.; Sivarama Sastry, G., Electronic switching in Ge—Bi—Se—Te glasses, Mat. Sci. and Eng. B12 (1992) 219-222.

Ramesh, K.; Asokan, S.; Sangunnim, K.S.; Gopal, E.S.R., Electrical switching in germanium telluride glasses doped with Cu and Ag, Appl. Phys. A 69 (1999) 421-425.

Rose, M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.; Owen,A.E., Aspects of non-volatility in a-Si:H memory devices, Mat. Res. Soc. Symp. Proc. V 258, 1992, 1075-1080.

Schuocker, D.; Rieder, G., On the reliabilty of amorphous chalcogenide switching devices, J. Non-Cryst. Solids 29 (1978) 397-407.

Sharma, A.K.; Singh, B.; Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of Pure and Applied Phys. 35 (1997) 424-427.

Snell, A.J.; Lecomber, P.G.; Hajto, J.; Rose, M.J.; Owen, A.E.; Osbourne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osbourne, L.S.; Holmes, A.; Owen, A.E.; Gibson, R.A.G., Analogue memory effects in metal/a-Si:H/ metal thin film structures, Mat. Res. Soc. Symp. Proc. V 297, 1993, 1017-1021.

Steventon, A.G., Microfilaments in amorphous chalcogenide memory devices, J. Phys. D: Appl. Phys: 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1—x and AsxSe1—x systems, J. Non-Cryst. Solids 261 (2000) 277-281.

Titus, S.S.K.; Chatterjee, R.; Asokan, S., Electrical switching and short-range order in As—Te glasses, Phys. Rev. B 48 (1993) 14650-14652.

Tranchant,S.;Peytavin,S.;Ribes,M.;Flank,A.M.;Dexpert,H.; Lagarde,J.P., Silver chalcogenide glasses Ag—Ge—Se: Ionic conduction and exafs structural investigation, Transport-structure relations in fast ion and mixed conductors Proceedings of the 6th Riso International Symposium. Sept. 9-13, 1985.

Tregouet, Y.; Bernede, J.C., Silver movements in Ag2Te thin films: switching and memory effects, Thin Solid Films 57 (1979) 49-54.

Unemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As—Te—Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M sytem, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE Electron Dev. Lett. 13 (1992)471-472.

Weirauch, D.F., Threshold switching and thermal filaments in amorphous semiconductors, App. Phys. Lett. 16 (1970) 72-73.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

Kawamoto, Y., Nishida, M., Ionic Condition in As2S3—Ag2S, GeS2—GeS—Ag2S and P2S5—Ag2S Glasses, J. Non-Cryst Solids 20(1976) 393-404.

Kozicki et al., Silver incorporation in thin films of selenium rich Ge—Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag—Ge—Se glasses, Microelectronic Engineering 63 (2002) pp. 155-159.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electrical properties of Ag2Se, J. Phys. Soc. Japan 13 (1958) 317.

D.B. Johnson, et al., "Lateral Diffusion in Ag—Se Thin-Film Couples" Journal of Applied Physics, vol. 40, No. 1, Jan. 1969, pp. 149-152.

* cited by examiner

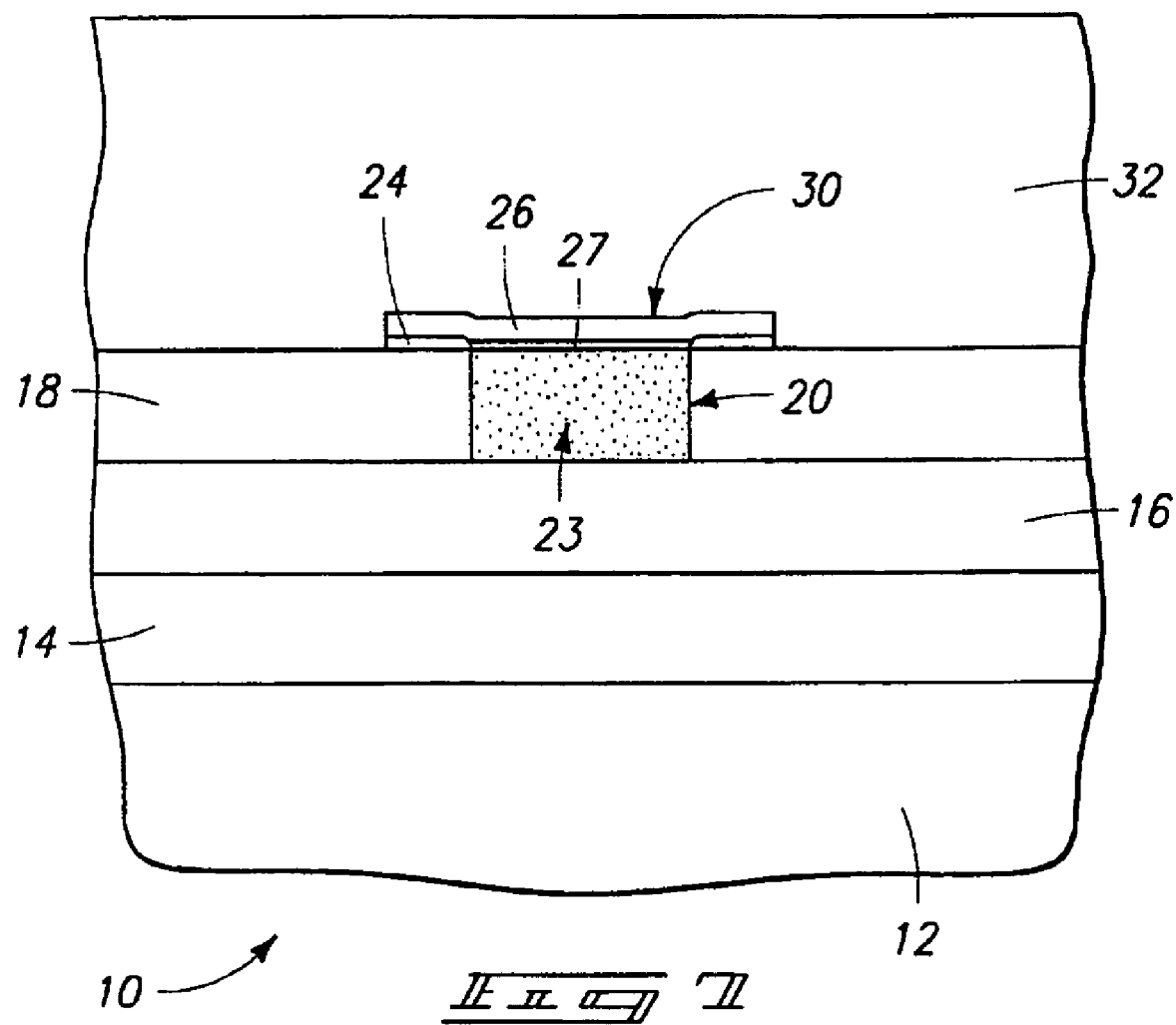

METHOD OF FORMING RESISTANCE VARIABLE DEVICES

This application is a division of U.S. patent application Ser. No. 09/943,199, now U.S. Pat. No. 6,955,940, filed Aug. 29, 2001, the disclosure of which is incorporated herein by reference.

TECHNICAL FIELD

This invention relates to methods of forming non-volatile resistance variable devices, for example to methods of forming a programmable memory cell of memory circuitry.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. The circuitry can be fabricated such that the data is volatile or non-volatile. Volatile storing memory devices result in loss of data when power is interrupted. Non-volatile memory circuitry retains the stored data even when power is interrupted.

This invention was principally motivated in making improvements to the design and operation of memory circuitry disclosed in the Kozicki et al. U.S. Pat. Nos. 5,761,115; 5,896,312; 5,914,893; and 6,084,796, which ultimately resulted from U.S. patent application Ser. No. 08/652,706, filed on May 30, 1996, disclosing what is referred to as a programmable metallization cell. Such a cell includes opposing electrodes having an insulating dielectric material received therebetween. Received within the dielectric material is a fast ion conductor material. The resistance of such material can be changed between highly insulative and highly conductive states. In its normal high resistive state, to perform a write operation, a voltage potential is applied to a certain one of the electrodes, with the other of the electrode being held at zero voltage or ground. The electrode having the voltage applied thereto functions as an anode, while the electrode held at zero or ground functions as a cathode. The nature of the fast ion conductor material is such that it undergoes a structural change at a certain applied voltage. With such voltage applied, a conductive dendrite or filament extends between the electrodes, effectively interconnecting the top and bottom electrodes to electrically short them together.

Once this occurs, dendrite growth stops, and is retained when the voltage potentials are removed. Such can effectively result in the resistance of the mass of fast ion conductor material between electrodes dropping by a factor of 1,000. Such material can be returned to its highly resistive state by reversing the voltage potential between the anode and cathode, whereby the filament disappears. Again, the highly resistive state is maintained once the reverse voltage potentials are removed. Accordingly, such a device can, for example, function as a programmable memory cell of memory circuitry.

The preferred resistance variable material received between the electrodes typically and preferably comprises a chalcogenide material having metal ions diffused therein. A specific example is germanium selenide having silver ions diffused therein. The present method of providing the silver ions within the germanium selenide material is to initially chemical vapor deposit the germanium selenide glass without any silver being received therein. A thin layer of silver is thereafter deposited upon the glass, for example by sputtering, physical vapor deposition or other technique. An exemplary thickness is 200 Angstroms or less. The layer of silver is irradiated, preferably with electromagnetic energy at a wavelength less than 500 nanometers. The thin nature of the deposited silver enables such energy to pass through the silver to the silver/glass interface effective to break a chalcogenide bond of the chalcogenide material. This may form $Ag_2Se$, which effectively dopes the glass with silver.

Saturation of silver in germanium selenide is apparently at a maximum of about 34 atomic percent or less depending on the germanium selenide stoichiometry. Yet, preferred existing technology for cell fabrication constitutes a concentration which is less than the maximum; in the case of 34 atomic percent maximum, an example concentration would be about 27 atomic percent.

After the chalcogenide comprising material is provided with silver to a desired concentration, the top electrode material (typically silver) is next deposited. But, as the silver doping/diffusion into the chalcogenide material approaches the maximum or saturation, some $Ag_2Se$ was discovered to form at the surface and remain there as opposed to diffusing into the glass. Further, the surface $Ag_2Se$ was typically in the form of semicircular nodules or bumps anywhere from 50 Angstroms to 20 microns across. Unfortunately when the typical silver electrode material is subsequently deposited, such tends to mound on top of these previous bumps. This can create voids to the doped germanium glass through the top electrode material, whereby the silver doped germanium selenide glass is partially exposed. Unfortunately, some of the photodeveloper solutions typically used for patterning the top electrode (i.e. tetramethyl ammonium hydroxide) will etch the glass that is exposed.

It would be desirable to overcome or at least reduce this problem. While the invention was principally motivated in overcoming this problem, it is in no way so limited. The artisan will appreciate applicability of the invention in other aspects unrelated to the problem, with the invention only being limited by the accompanying claims as literally worded and as appropriately interpreted in accordance with the doctrine of equivalents.

SUMMARY

The invention includes methods of forming a programmable memory cell of memory circuitry and non-volatile resistance variable devices. In one implementation, a method of forming a non-volatile resistance variable device includes forming a first conductive electrode material on a substrate. A metal doped chalcogenide comprising material is formed over the first conductive electrode material. The chalcogenide comprising material comprises the metal and $A_xB_y$, where "B" is selected from the group consisting of S, Se and Te and mixtures thereof; and where "A" comprises at least one element which is selected from Group 13, Group 14, Group 15, or Group 17 of the periodic table. A passivating material is formed over the metal doped chalcogenide comprising material. A second conductive electrode material is formed over the passivating material. The second conductive electrode material is formed into an electrode of the device.

In one implementation, a method of forming a non-volatile resistance variable device includes forming a first conductive electrode material on a substrate. A metal doped chalcogenide comprising material is formed over the first conductive electrode material. The chalcogenide comprising material comprises the metal and $A_xB_y$, where "B" is selected from the group consisting of S, Se and Te and mixtures thereof, and where "A" comprises at least one element which is selected from Group 13, Group 14, Group 15, or Group 17 of the periodic table. The metal doped chalcogenide electrode material has an outer surface. In one aspect, the outer surface is exposed to an HNO$_3$ solution. In one aspect, the outer surface is oxidized effective to form a layer comprising at least one of an oxide of "A" or an oxide of "B". After the oxidizing, a second conductive electrode material is deposited over the layer, and a second conductive electrode material of the device is ultimately formed therefrom.

Other implementations and aspects are contemplated and disclosed.

BRIEF DESCRIPTION OF THE DRAWINGS

Preferred embodiments of the invention are described below with reference to the following accompanying drawings.

FIG. 7 is a view of the FIG. 1 wafer fragment at a processing step subsequent to that shown by FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
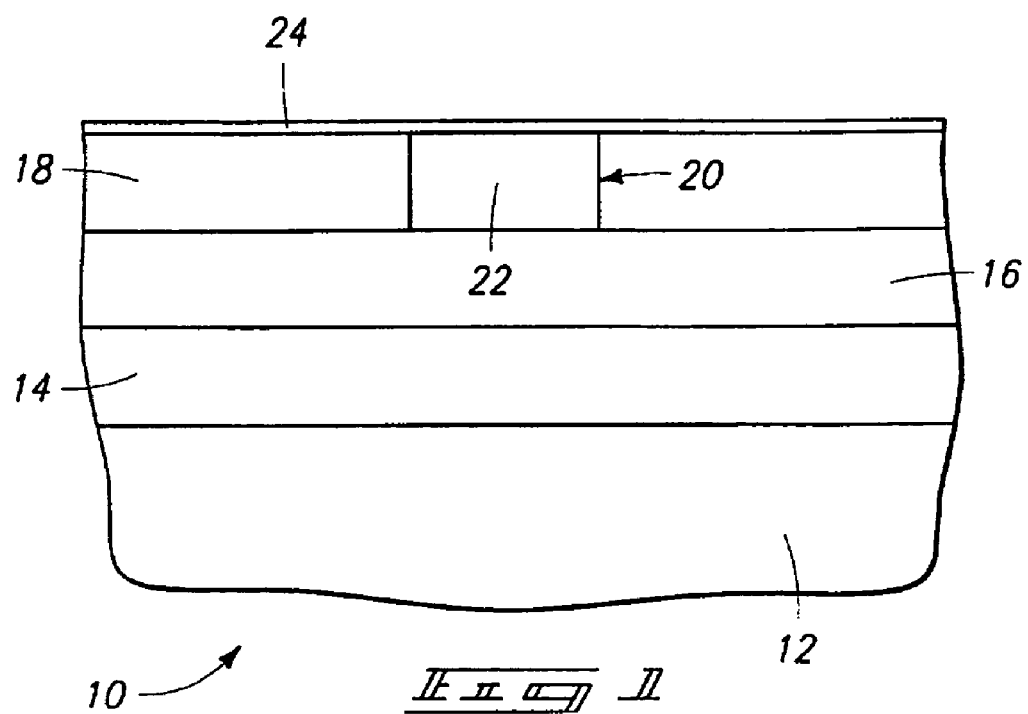
FIG. 1 is a diagrammatic sectional view of a semiconductor wafer fragment in process in accordance with an aspect of the invention.

Referring to FIG. 1, a semiconductor wafer fragment 10 is shown in but one preferred embodiment of a method of forming a non-volatile resistance variable device. By way of example only, example such devices include programmable metallization cells and programmable optical elements of the patents referred to above, further by way of example only, including programmable capacitance elements, programmable resistance elements, programmable antifuses of integrated circuitry and programmable memory cells of memory circuitry. The above patents are herein incorporated by reference. The invention contemplates the fabrication techniques and structure of any existing non-volatile resistance variable device, as well as yet-to-be developed such devices. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Further, it will be appreciated by the artisan that "resistance variable device" includes devices wherein a property or properties in addition to resistance is/are also varied. For example, and by way of example only, the device's capacitance and/or inductance might also be changed in addition to resistance.

Semiconductor wafer fragment 10 comprises a bulk monocrystalline semiconductive material 12, for example silicon, having an insulative dielectric layer 14, for example silicon dioxide, formed thereover. A first conductive electrode material 16 is formed over dielectric layer 14. By way of example only, preferred materials include any of those described in the incorporated Kozicki et al. patents referred to above in conjunction with the preferred type of device being fabricated. A dielectric layer 18 is formed over first electrode material 16. Silicon nitride is a preferred example.

An opening 20 is formed through layer 18 to conductive electrode layer 16. Such is filled with a chalcogenide comprising material 22 to a first thickness, which in this example is essentially defined by the thickness of layer 18. By way of example only, an exemplary first thickness range is from 100 Angstroms to 1000 Angstroms. The chalcogenide comprising material comprises $A_xB_y$, where "B" is selected from the group consisting of S, Se and Te and mixtures thereof, and where "A" comprises at least one element which is selected from Group 13 (B, Al, Ga, In, Tl), Group 14 (C, Si, Ge, Sn, Pb), Group 15 (N, P, As, Sb, Bi), or Group 17 (F, Cl, Br, I, At) of the periodic table. By way of example only, preferred elements for "A" are Ge and Si. An example preferred method of forming material 22 over substrate 10 is by chemical vapor deposition to completely fill opening 20, followed by a planarization technique, for example chemical mechanical polishing. Material 22 is preferably formed to be amorphous and remains amorphous in the finished device.

A metal comprising layer 24 is formed to a second thickness over chalcogenide comprising material 22. An example and preferred material for layer 24 is elemental silver. By way of example only, example alternates include zinc and copper. In one preferred embodiment, the second thickness is less than the first thickness. In one preferred embodiment, layer 24 is predominately (majority) elemental silver, and can consist or consist essentially of elemental silver.

Figure 2:
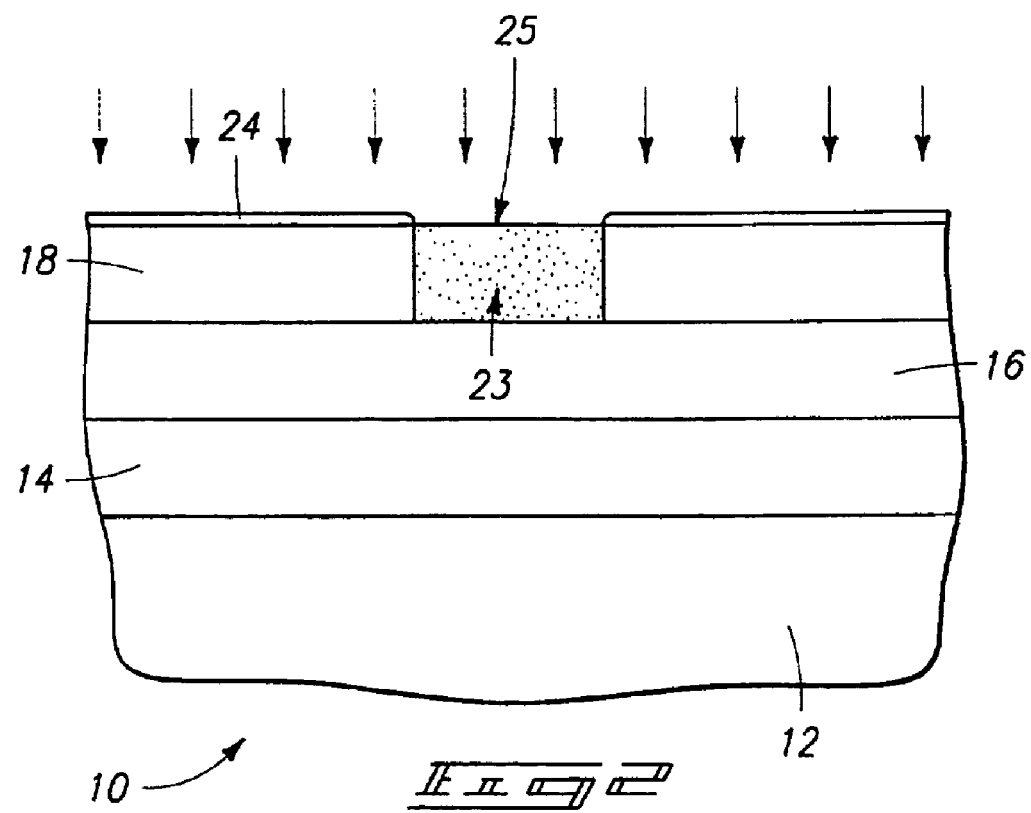
FIG. 2 is a view of the FIG. 1 wafer fragment at a processing step subsequent to that shown by FIG. 1.

Referring to FIG. 2, metal 24 is irradiated effective to break a chalcogenide bond of the chalcogenide comprising material at an interface of metal 24 and chalcogenide comprising material 22, and diffuse at least some of metal 24 into chalcogenide comprising material 22. In FIG. 2, material 22 is designated with numeral 23 and peppered in the drawings to indicate metal ions being received therein. A preferred irradiating includes exposure to actinic radiation having a wavelength from about 164-904 nanometers, with radiation exposure at between 404-408 nanometers being a more specific example. A more specific example is a flood UV exposure tool operating at 4.5 milliwatts/cm$^2$ energy for 15 minutes in an oxygen-containing ambient at room temperature and pressure. A mechanism of incorporation might include Ag$_2$Se formation at the chalcogenide surface/interface, and diffusion doping thereof into material 22.

All of material 24 received directly over chalcogenide comprising material 22 might be diffused to within such material as shown, or only some portion thereof might. The thickness of layer 24 is also chosen to be suitably thin to enable the impinging electromagnetic radiation to essentially transparently pass through material 24 to the interface of such material with chalcogenide comprising material 22.

The exemplary preferred thickness is as described above in comparison with the thickness of chalcogenide comprising material 22, and is preferably less than or equal to 200 Angstroms. The apparent linear thickness of layer 24 as a percentage of the linear thickness of chalcogenide comprising material 22 effectively results in the same approximate metal incorporation in atomic percent within the chalcogenide comprising material. Chalcogenide comprising material 22/23 can be considered as having an outer surface 25. Such provides but one example of forming a metal doped chalcogenide comprising material. Any other method in the context of this invention is contemplated, whether existing at the time of this writing or yet-to-be-developed.

Figure 3:
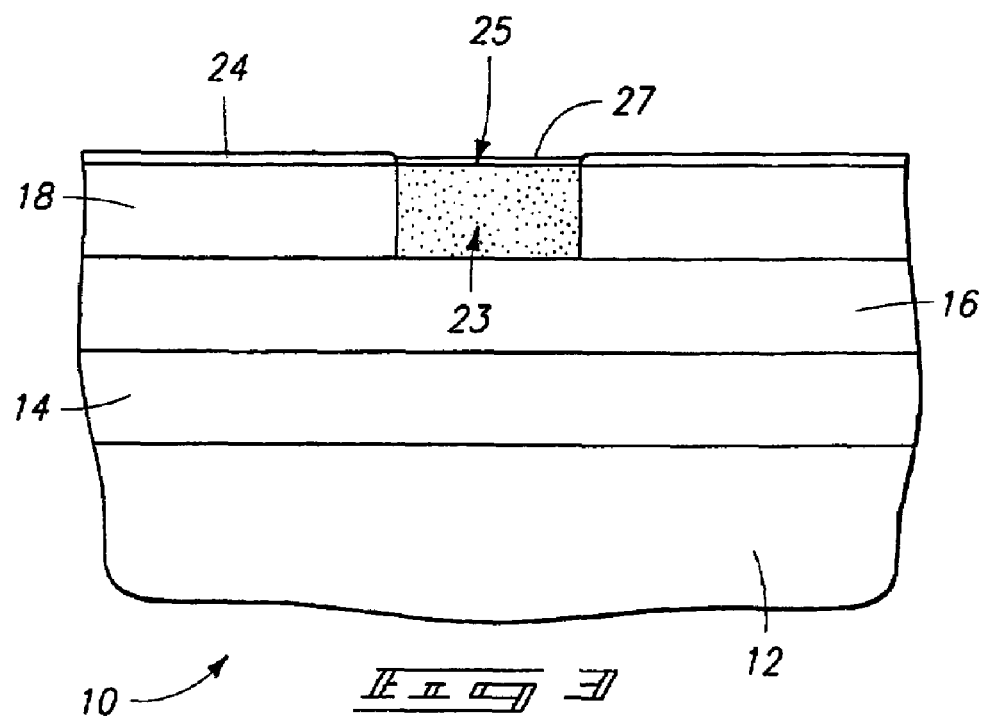
FIG. 3 is a view of the FIG. 1 wafer fragment at a processing step subsequent to that shown by FIG. 2.
Figure 4:
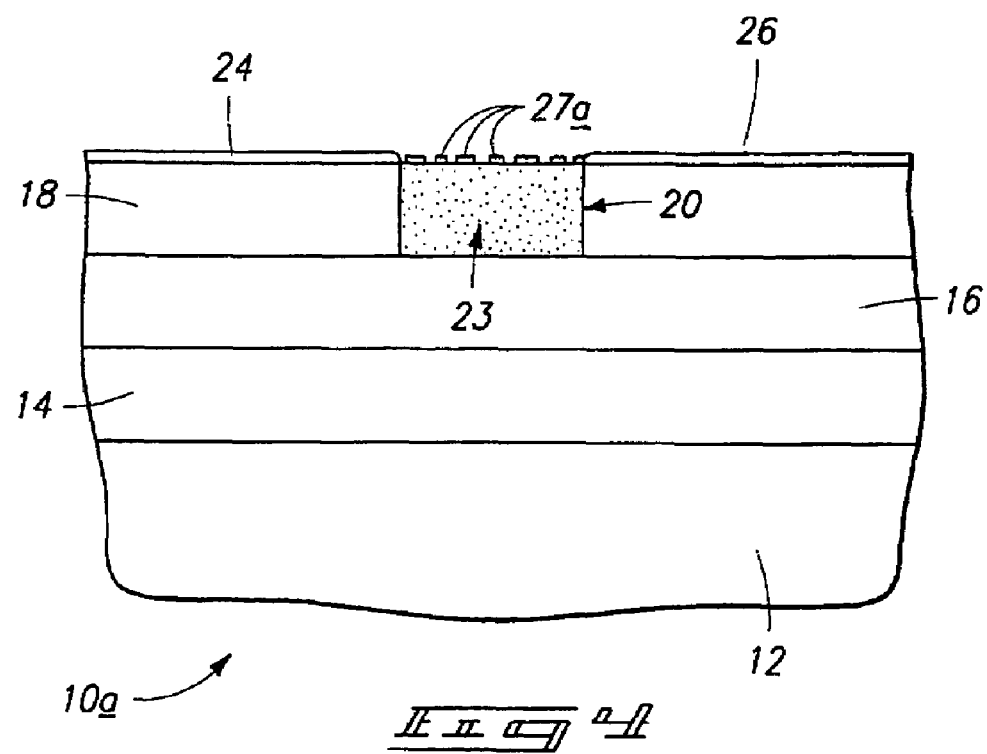
FIG. 4 is a view of the FIG. 1 wafer fragment at an alternate processing step to that shown by FIG. 3.

Referring to FIG. 3, and in but one aspect of the invention, a passivating material 27 is formed at least over the metal doped chalcogenide comprising material. Passivating material 27 might be formed to be continuous and completely covering at least over the chalcogenide comprising material as shown in FIG. 3, or might be formed not to be continuous and not to be completely covering over the chalcogenide comprising material as shown in an alternate embodiment of FIG. 4. In FIG. 4, like numerals from the first embodiment are utilized with differences being indicated by the suffix "a". Regardless, in the context of this document, a "passivating material" comprises a material the presence of which improves degree of continuity and covering over the chalcogenide comprising material of a subsequently deposited second conductive electrode material than would otherwise occur under identical deposition conditions for the second conductive electrode material but for presence of the passivating material. In one preferred embodiment, and as shown, the passivating material is formed on (in contact with) chalcogenide comprising material 23. The passivating material might comprise some form of oxide, nitride or material(s) which do/does not include oxides or nitrides. In one implementation, the passivating material is dielectric in nature. Passivating material 27/27a preferably is of a thickness from 1 Angstrom to 100 Angstroms, and more preferably from 1 Angstrom to 50 Angstroms. In one preferred implementation, the passivating material comprises an outer portion of the metal doped chalcogenide comprising material which is at least in part characterized by a higher concentration of "A" than metal doped chalcogenide comprising material immediately inwardly thereadjacent.

In one aspect, the passivating material is formed by exposing the substrate or outer surface 25 to ambient room temperature and pressure for a period of time effective to form the passivating material. In one aspect, the period of time is for at least 48 hours prior to a subsequent electrode material deposition. In one aspect, the period of time is for at least 60 hours. In one aspect, the period of time is for at least 72 hours. In one aspect, the period of time is for at least 96 hours. In one aspect, at least the outer surface of the substrate is shielded from ambient room light during the exposing. In reduction to practice examples, substrates were placed within wafer storage boxes within a clean room environment. Such boxes shielded the substrates from ambient clean room light, provided static discharge isolation, but otherwise exposed the substrates to the clean room ambient including clean room temperature (about 20° C.) and pressure (atmospheric). Significant improvement in continuity and covering of a subsequently deposited silver electrode layer occurred after exposure to such an ambient for 48 hours and prior to such silver deposition. Even greater improvement was demonstrated after 96 hours.

In one aspect, the passivating material is formed by exposing the outer surface to an atmosphere having a temperature elevated from ambient room temperature for a period of time effective to form the passivating material. The period of time will be at least in part dependent upon the atmosphere and the temperature. In one implementation, the atmosphere comprises oxygen. In another implementation, the atmosphere is substantially void of oxygen. Oxygen presence is expected to reduce the period of time.

In one aspect, the passivating material can be formed by exposing the substrate or outer surface 25 to a plasma comprising at least one of oxygen or hydrogen prior to a subsequent electrode material deposition. In one exemplary implementation where the plasma comprises oxygen, the plasma is derived from a gas comprising $O_2$. In one exemplary implementation where the plasma comprises hydrogen, the plasma is derived from a gas comprising $H_2$. A preferred plasma tool for processing is a cold wall single wafer plasma sputtering system. Exemplary cathode power during processing in such a system is from about 100 W to 400 W for an eight inch wafer. Chuck power is preferably low to minimize etch effects. Exemplary chuck power is from about 3 W to 10 W for an eight inch wafer. Exemplary pressure during processing is from about 3 mTorr to about 50 mTorr. Exposure time can vary from a few seconds to several minutes, or more.

In one aspect, the passivating material can be formed by exposing the substrate or outer surface 25 to an aqueous solution prior to a subsequent electrode material deposition. In one preferred implementation, the aqueous solution consists essentially of $H_2O$. Other aqueous solutions are of course contemplated. Exemplary solution and exposure conditions include a temperature range from about 15° C. to about 100° C. A preferred exposure pressure is clean room ambient. Exposure time can vary from a few seconds to several minutes, or more.

The passivating material formation can occur by other means, whether existing or yet to be developed, are also of course contemplated.

In one aspect, metal doped chalcogenide electrode material 23/outer surface 25 is oxidized effective to form the passivating material to comprise at least one of an oxide of "A" or an oxide of "B", and independent of constituting a "passivating material" as defined herein. In one preferred embodiment, the passivating material is substantially continuous, at least over chalcogenide comprising material 23. In one preferred embodiment, the passivating material is preferably no greater than 50 Angstroms thick, with a preferred range being from 8 Angstroms to 50 Angstroms, and a specific preferred example being 10 Angstroms thick. Further in one preferred embodiment, the passivating material is formed to be dielectric. Further in one preferred embodiment, the layer comprises an oxide of "A". In one preferred embodiment, the layer comprises and oxide of "B". In one preferred embodiment, the layer comprises at least one oxide of "A" and at least one oxide of "B". One preferred method of oxidizing includes exposure to $HNO_3$, for example exposure to a $HNO_3$ solution. By way of example only, a concentration range for such $HNO_3$ solution is to provide one volume part of a 49 percent-by-volume $HNO_3$ solution in from one additional volume part of water to 100 additional volume parts of water. Exemplary exposure conditions include ambient temperature and pressure, although higher or lower temperature and/or pressure conditions from ambient are also of course contemplated. By way of example only, an exposure time might be anywhere from one second to ten minutes.

Further by way of example only, alternate exemplary oxidizing includes exposure to a fluid consisting essentially of $H_2O$, exposure to $H_2O_2$, exposure to $O_2$, and/or exposure to $O_3$. Further by way of example only, such $O_2$ or other exposure might be by an elevated temperature anneal at from 50° C. to 133° at ambient, subatmospheric or higher pressure, and for an exemplary time range of anywhere from a few seconds to five hours.

The invention contemplates exposure of the outer surface of a chalcogenide comprising material in the context of the claimed combination to a $HNO_3$ solution independent of the stated effect of passivating, oxidizing, formation of a layer, or any other utility stated or inferred herein.

Figure 5:
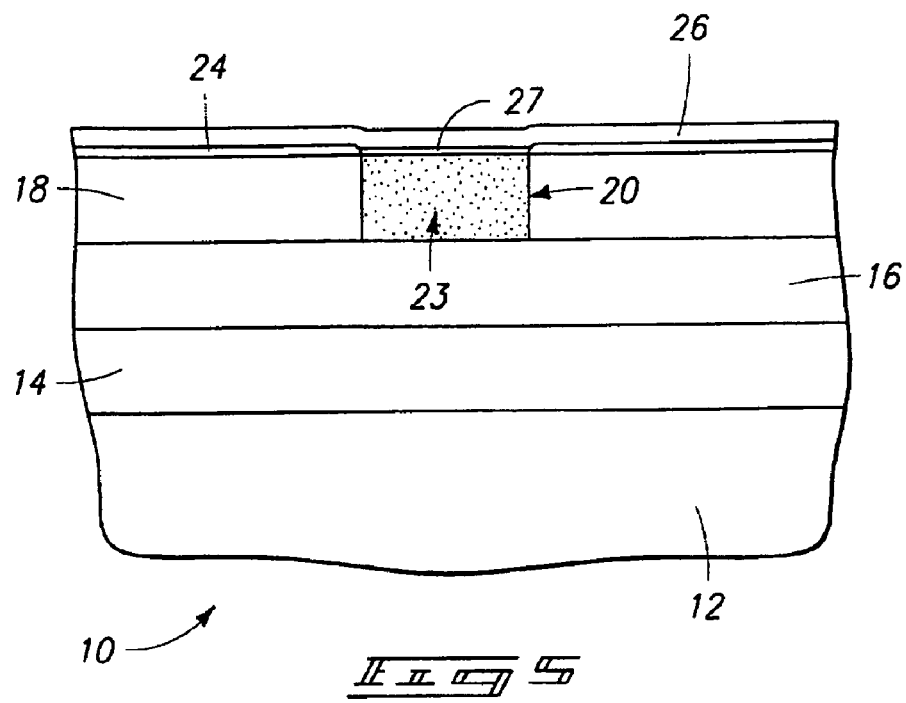
FIG. 5 is a view of the FIG. 1 wafer fragment at a processing step subsequent to that shown by FIG. 3.

Referring to FIG. 5, after the oxidizing and/or passivating, a second conductive electrode material 26 is deposited over chalcogenide comprising material 23 and over material 27. Preferably as shown, material 26 is formed on (in contact with) material 27. In the preferred embodiment, such second conductive electrode material is continuous and completely covers at least over chalcogenide comprising material 23. An example preferred thickness range for second electrode material layer 26 is from 140 Angstroms to 200 Angstroms. The first and second conductive electrode materials might be the same material(s), or different material(s). By way of example only, preferred top and bottom electrode materials include silver, tungsten, platinum, nickel, carbon, chromium, molybdenum, aluminum, magnesium, copper, cobalt, palladium, vanadium, titanium, alloys thereof and compounds including one or more of these elements. In accordance with a preferred programmable metallization cell embodiment, and where "A" is Ge, at least one of materials 16 and 26 comprises silver. During formation of layer 26, some of it might diffuse into layer 23. Layer 26 and any remnant material 24 received directly over chalcogenide comprising material 23 will constitute one electrode of the resistance variable device being fabricated, with layer 16 constituting another or second electrode for the device.

Figure 6:
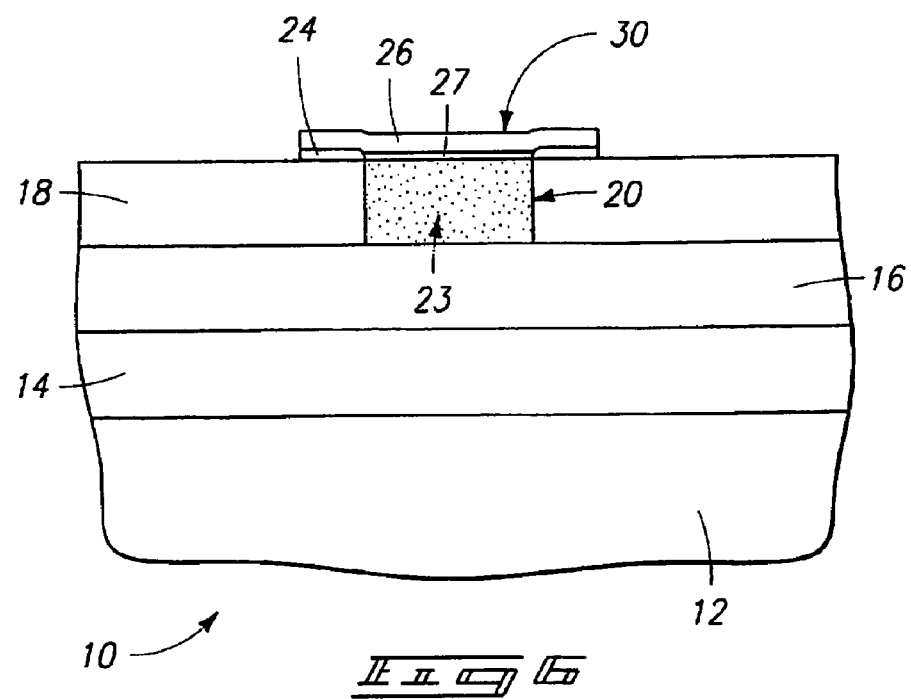
FIG. 6 is a view of the FIG. 1 wafer fragment at a processing step subsequent to that shown by FIG. 4.

Referring to FIG. 6, materials 24 and 26 are patterned into an electrode 30. Patterning to produce electrode 30 is typically and preferably conducted utilizing photolithography. Such provides but one preferred example of forming a second electrode material operatively proximate the chalcogenide comprising material. In a preferred embodiment, such results in the formation of a non-volatile resistance variable device which is fabricated into a programmable memory cell of memory circuitry. In one preferred embodiment, the device is finally formed to have a concentration of metal in chalcogenide comprising material 23 of less than 30% atomic in a lowest of a plurality of variable resistance states.

Referring to FIG. 7, one or more dielectric layers 32 are ultimately formed over the device. Of course, intervening conductive and semiconductive layers might also be provided to form other lines and devices outwardly of the depicted device.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a resistance variable device comprising:
   forming a first conductive electrode on a substrate;
   forming a metal doped chalcogenide comprising material over the first conductive electrode, the metal doped chalcogenide comprising material comprising a metal and $A_xB_y$, where B is selected from the group consisting of S, Se and Te and mixtures thereof, and where A comprises at least one element which is selected from Group 13, Group 14, Group 15, or Group 17 of the periodic table, the metal doped chalcogenide comprising material having an outer surface;
   exposing the outer surface of the metal doped chalcogenide comprising material to a passivating agent, thereby forming a discontinuous passivation material over the metal doped chalcogenide comprising material; and
   forming a second conductive electrode over the metal doped chalcogenide comprising material and the discontinuous passivating material.

2. The method of claim 1 wherein the exposing to a passivating agent step comprises exposing for at least 48 hours prior to forming the second conductive electrode.

3. The method of claim 1 wherein the exposing to a passivating agent step comprises exposing the outer surface to a temperature elevated from ambient room temperature prior to forming the second conductive electrode.

4. The method of claim 1 wherein the exposing to a passivating agent step comprises exposing the outer surface to a plasma comprising at least one of oxygen or hydrogen prior to depositing the second conductive electrode material.

5. The method of claim 1 wherein the exposing to a passivating agent comprises exposing the substrate to an aqueous solution.

6. The method of claim 1 wherein the passivating agent comprises oxygen.

7. The method of claim 1 wherein the passivating agent is substantially void of oxygen.

8. The method of claim 1 wherein the exposing to a passivating agent results in an outer portion of the metal doped chalcogenide comprising material having a higher concentration of A than an inner portion of said metal doped chalcogenide comprising material.

9. The method of claim 1 wherein the passivating agent comprises oxygen plasma.

10. The method of claim 1 wherein the passivating agent comprises hydrogen plasma.

11. The method of claim 1 wherein the passivating agent consists essentially of $H_2O$.

12. The method of claim 1 wherein the exposing to the passivating agent is performed at a maintained temperature of from about 15° C. to about 100° C.

13. The method of claim 1 wherein the passivating agent consists essentially of $H_2O$ and the exposing is performed at a temperature of from about 15° C. to about 100° C. and in a room ambient pressure.

14. The method of claim 1, wherein the outer surface is formed having an uneven surface.

15. The method of claim 1, wherein the passivating step prepares the outer surface for forming the second conductive electrode such that during forming of the second conductive electrode, the chalcogenide comprising material is protected from being etched.

16. The method of claim 1, wherein B includes S.

17. The method of claim 1 wherein B includes Se.

18. The method of claim 1 wherein B includes Te.

19. The method of claim 1 wherein A comprises as least one element from Group 13.

20. The method of claim 1 wherein A comprises as least one element from Group 14.

21. The method of claim 20, wherein B is S.

22. The method of claim 20, wherein B is Se.

23. The method of claim 20, wherein B is Te.

24. The method of claim 1 wherein A comprises as least one element from Group 15.

25. The method of claim 24, wherein B is S.

26. The method of claim 24, wherein B is Se.

27. The method of claim 24, wherein B is Te.

28. The method of claim 1 wherein A comprises as least one element from Group 17.

29. The method of claim 28, wherein B is S.

30. The method of claim 28, wherein B is Se.

31. The method of claim 28, wherein B is Te.

32. A method of forming a resistance variable device, comprising:
   forming a first electrode over a substrate;
   forming a chalcogenide glass layer over the first electrode, the chalcogenide glass comprising a metal so that the chalcogenide glass layer forms a conductive dendrite in response to an applied voltage, said chalcogenide glass layer having an outer surface;
   preparing the outer surface for formation of a second electrode thereover by passivating the outer surface with a passivating agent, wherein the passivating changes the outer surface so as to have a higher concentration of germanium than a portion of the chalcogenide glass layer below the outer surface; and
   forming the second electrode over the passivated outer surface such that no part of the chalcogenide glass layer is exposed through the second electrode.

33. The method of claim 32 wherein the outer surface is exposed to the passivating agent for at least 48 hours.

34. The method of claim 32 wherein the outer surface is exposed to the passivating agent for at least 60 hours.

35. The method of claim 32 wherein the outer surface is exposed to the passivating agent for at least 72 hours.

36. The method of claim 32 wherein the outer surface is exposed to the passivating agent for at least 96 hours.

37. The method of claim 32 wherein the outer surface is exposed to the passivating agent while also shielding the outer surface from light.

38. The method of claim 32 wherein the passivating agent comprises a material selected from the group consisting of an oxygen-comprising plasma, a hydrogen-comprising plasma, $H_2O$, an $HNO_3$ solution, $H_2O_2$, $O_2$, and $O_3$.

39. A method of forming a resistance variable device, comprising:
   forming a first conductive electrode over a substrate;
   forming a metal doped chalcogenide comprising material over the first conductive electrode material, the chalcogenide material comprising a metal and $A_xB_y$, where B is selected from the group consisting of S, Se and Te and mixtures thereof, and where A comprises at least one element which is selected from Group 13, Group 14, Group 15, or Group 17 of the periodic table, the metal doped chalcogenide electrode material having an outer surface;
   forming a discontinuous passivating material at an outer surface of the metal doped chalcogenide comprising material, said discontinuous passivating material having a higher concentration of A than an inner portion of the metal doped chalcogenide comprising material; and
   after the forming the discontinuous passivating material, forming a second conductive electrode over the passivating material and metal doped chalcogenide comprising material.

40. The method of claim 39 wherein the $HNO_3$ in provided as a 49 percent by volume aqueous solution.

41. The method of claim 39 comprising exposing said outer surface to said $HNO_3$ for a period of from about one second to about ten minutes.

42. The method of claim 39 wherein the first and second conductive electrode are different materials.

43. The method of claim 39 wherein the exposing to $HNO_3$ forms a discontinuous layer comprising at least one of an oxide of A or an oxide of B on the metal doped chalcogenide electrode material outer surface.

44. The method of claim 39 wherein A comprises Ge.

45. The method of claim 39 wherein A comprises Ge, and B comprises Se.

46. The method of claim 39 wherein the metal comprises Ag.

47. A method of forming a resistance variable device, comprising:
   forming a first conductive electrode over a substrate;
   forming a silver doped chalcogenide comprising material over the first conductive electrode, the chalcogenide material comprising silver and $A_xB_y$, where B is selected from the group consisting of S, Se and Te and mixtures thereof, and where A comprises at least one element which is selected from Group 13, Group 14, Group 15, or Group 17 of the periodic table, the silver doped chalcogenide electrode material having an outer surface;
   passivating the silver doped chalcogenide comprising material outer surface by forming a region having a higher concentration of A than the silver doped chalcogenide comprising material further from said outer surface; and
   after the passivating, forming a second conductive electrode over the region having a higher concentration of A.

48. The method of claim 47 wherein A comprises Ge.

49. The method of claim 47 wherein A comprises Ge, and B comprises Se.

50. The method of claim 47 wherein the second conductive electrode comprises elemental silver.

51. The method of claim 47 wherein the passivating comprises exposure to at least one of the group consisting of $HNO_3$, $H_2O$, $H_2O_2$, $O_2$, $O_3$, and solutions thereof.

52. The method of claim 47 comprising forming the second conductive electrode on the region having a higher concentration of A.

* * * * *

UNITED STATES PATENT AND TRADEMARK OFFICE
CERTIFICATE OF CORRECTION

PATENT NO. : 7,348,205 B2  Page 1 of 1
APPLICATION NO. : 11/085009
DATED : March 25, 2008
INVENTOR(S) : Campbell et al.

It is certified that error appears in the above-identified patent and that said Letters Patent is hereby corrected as shown below:

In column 8, line 49, in Claim 10, delete "claim" and insert -- claim 1 --, therefor.

In column 8, line 49, in Claim 10, after "agent" delete "1".

Signed and Sealed this

Tenth Day of June, 2008

JON W. DUDAS
*Director of the United States Patent and Trademark Office*